United States Patent [19]
Tanida

[11] Patent Number: 5,962,868
[45] Date of Patent: Oct. 5, 1999

[54] SEMICONDUCTOR DEVICE HAVING CONTACT CHECK CIRCUIT

[75] Inventor: Susumu Tanida, Hyogo, Japan

[73] Assignee: Mitsubishi Denki Kabushiki Kaisha, Tokyo, Japan

[21] Appl. No.: 09/017,810

[22] Filed: Feb. 3, 1998

[30] Foreign Application Priority Data

Jul. 14, 1997 [JP] Japan ..................... 9-188405

[51] Int. Cl.$^6$ .................................................. H01L 23/58
[52] U.S. Cl. ........................... 257/48; 257/415; 324/757; 324/765
[58] Field of Search ................ 257/48, 415; 324/754, 324/757, 765; 438/18

[56] References Cited

U.S. PATENT DOCUMENTS 3,781,683  12/1973  Freed ............................. 324/158 F
5,652,632  7/1997  Shimizu ............................. 349/40

FOREIGN PATENT DOCUMENTS 4-147637  5/1992  Japan .
4-333252  11/1992  Japan .

*Primary Examiner*—Valencia Martin-Wallace
*Attorney, Agent, or Firm*—McDermott, Will & Emery

[57] ABSTRACT

A contact check circuit of a semiconductor device includes N-channel MOS transistors connected in series between pads located at opposing ends, with their gates respectively connected to intermediate pads. At the contact check, conduction between opposing pads is checked, applying an "H" level to probes corresponding to the pads. Thus contact between the pads and probes of a semiconductor testing apparatus can be checked at once.

4 Claims, 6 Drawing Sheets

SEMICONDUCTOR DEVICE HAVING CONTACT CHECK CIRCUIT

BACKGROUND OF THE INVENTION

1. Field of the Invention

The present invention relates generally to a semiconductor device, and, more particularly, to a semiconductor device having a contact check circuit for checking a contact between a plurality of pads for receiving external signals and a plurality of probes of a semiconductor testing apparatus prior to a test.

2. Description of the Background Art

Conventionally, a burn-in test has been performed for semiconductor devices such as a DRAM (Dynamic Random Access Memory). This test accelerates an early failure by driving a device as a wafer under the severe condition with higher voltage and higher temperature than usual.

In a burn-in test, signals are input from a semiconductor testing apparatus to a semiconductor device through a plurality of probes of the semiconductor testing apparatus in contact with a plurality of pads of the semiconductor device. Burn-in test cannot be properly performed if probes and pads are not in appropriate contact. Thus, a contact check circuit is provided in each semiconductor device in order to check the contact between probes and pads prior to a burn-in test.

FIG. 8 is a schematic diagram showing a configuration of a conventional semiconductor device 50 having a contact check circuit 55. As shown in FIG. 8, semiconductor device 50, formed on a semiconductor wafer (a silicon wafer, for example) includes a ground pad P10, signal pads P11–P14, contact check circuit 55 and an internal circuit 56.

Ground pad P10 receives ground potential GND from outside (semiconductor testing device). Signal pads P11–P14 receive external signals respectively. Contact check circuit 55 includes N-channel MOS transistors 51–54. N-channel MOS transistors 51–54 are connected between each one of signal pads P11–P14 and ground pad 10, respectively, with their gates connected together to ground pad P10. Internal circuit 56 performs a prescribed operation (data writing and data reading in the case of a DRAM) in accordance with the signals externally input through pads P10–P14.

FIG. 9 is a schematic diagram illustrating a method for checking a contact between pads P10–P14 of semiconductor device 50 and probes 60–64 of a semiconductor testing apparatus 70. With reference to FIG. 9, semiconductor testing apparatus 70 includes a relay 71, an ammeter 73, and a direct-current power supply 74. Probe 60 is grounded. Probes 61–64 are connected to switching terminals 72.1–72.4 of relay 71, respectively. A negative potential −V is applied to a common terminal 72.0 of relay 71 through ammeter 73 by direct current power supply 74.

In order to check contact, a negative potential −V is applied to probe 61 by conducting a current between terminal 72.0 and terminal 72.1 of relay 71, for example. Only when pads P10, P11 and probes 60, 61 are in appropriate contact, respectively, N-channel MOS transistor 51 is rendered conductive, causing a current flow into ammeter 73. When pad P10 and probe 60 and/or pad P11 and probe 61 is not in appropriate contact, no current flows into ammeter 73. Thus, a contact check between pads P10, P11 and probes 60, 61 is allowed. Contacts between other pads P12–P14 and other probes 62–64 can be checked in the same manner.

The conventional method for contact check, however, is time-consuming because pad-to-pad checking is required.

Time required for contact check can be reduced by performing contact check of all pads P10–P14 simultaneously. In this case, however, the cost of semiconductor testing apparatus 74 becomes high because it is necessary to provide as many ammeters 73 as pads P11–P14.

In addition, the conventional method of contact check is not suitable for checking a pad of DRAM to which a positive potential such as power supply potential Vcc, or a boosted potential Vpp is applied, because. in this method a negative potential −V is applied to a pad to be checked. Generally, when a CMOS inverter, for example, exists in a chip circuit, a pad for power supply potential Vcc is connected to an N-well, too. In a P-type silicon substrate, a level of an N-well possibly be lower than a level of P-type silicon substrate, if a pad for power supply potential Vcc attains a negative potential. In such a case, a heavy current caused by a forward-biased PN junction destroys internal circuit 56.

SUMMARY OF THE INVENTION

A main object of the present invention is, therefore, to provide a semiconductor device which allows a quick contact check with a simple device and further allows contact check of a pad to which a positive potential is applied.

Briefly stated, a contact check circuit according to the present invention includes first to N-2th transistors connected in series between a first pad and an Nth pad. Input electrodes of the first to N-2th transistors are connected to the second to N-1th pads, respectively. At the contact check, a test signal is given to each one of the second to N-1st probes in order to conduct a current through each one of the first to N-2th transistors. Conduction between the first and the Nth probes is checked. Contact between probes and pads is determined to be appropriate when a current flows between the first and the Nth probes, whereas probes and pads are determined to be not in appropriate contact when no current flows between the first and the Nth probes.

Thus contact between probes and pads can be checked at once. Therefore, time required for contact check is greatly reduced compared with the conventional pad-to-pad checking method. In addition, cost increase and complication of a semiconductor testing apparatus are prevented because what is necessary is only to give the test signals to the second to N-1th probes and to check conduction between the first and the Nth probes. Further, use of a signal with a positive potential as a test signal is allowed by the use of N-channel MOS transistor, whereby a contact check of a pad to which a positive potential signal is applied is possible without any inconvenience as experienced in the conventional art.

Preferably, the contact check circuit further includes first to N-2th resistive elements connected between input electrodes of the first to N-2th transistors and the first pad, respectively. At the contact check, an inactivation potential is applied to the first probe in order to render the first to N-2th transistors nonconductive. In this case, when the second probe and the second pad, for example, do not contact suitably, the first transistor can be rendered nonconductive for sure by an inactivation potential applied to the first pad. Thus, a mistake in check caused by the second pad charged to the activation potential can be prevented.

Preferably, one of the second to N-1th pads is used as a chip select pad. At the contact check a chip select signal, instead of a test signal, is applied to a probe corresponding to the pad. This is advantageous because it allows sequential selection and checking of a plurality of chips formed on a wafer.

More preferably, the contact check circuit further includes a first resistive element connected between an input electrode of the first chip select transistor and first pad, and second to N-2th sets of chip select transistors and resistive elements series-connected between input electrodes of transistors other than the first chip select transistor and the first pad, respectively. At the time of contact check, an inactivation potential is applied to the first probe in order to render each transistor nonconductive. In this case, current is prevented to flow between the second to Nth pads and the first pad except at the contact check. Thus current consumption would be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
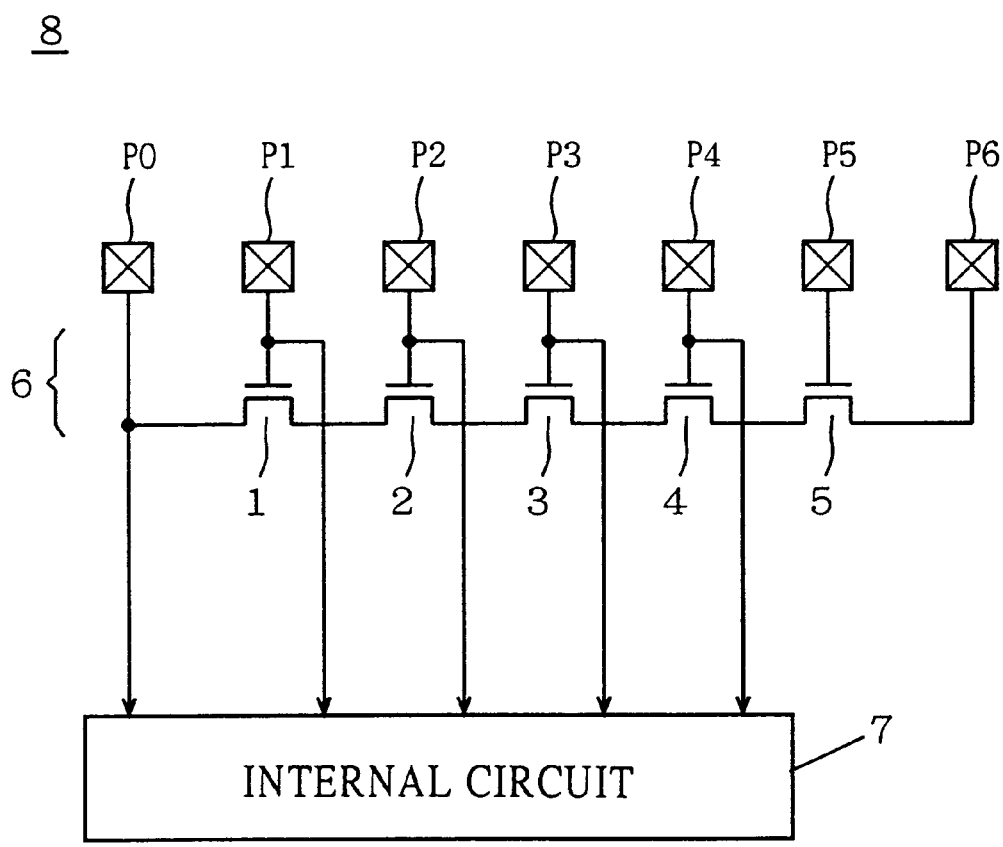
FIG. 1 is a schematic diagram showing a configuration of a semiconductor device according to a first embodiment of the invention.

FIG. 1 shows a schematic diagram of the configuration of a semiconductor device 8 in accordance with the first embodiment of the invention. Referring to FIG. 1, semiconductor device 8, formed on a semiconductor wafer, includes a ground pad P0, power supply or signal pads P1–P4, a chip select pad P5, a check pad P6, a contact check circuit 6 and an internal circuit 7.

A ground potential GND is applied to ground pad P0. At a burn-in test for a wafer, power supply or signal pads P1–P4 are used. Chip select pad P5 is used for selecting a chip to be checked among multiple chips formed on a wafer. Check pad P6 for checking whether a pad to be checked contacts with a probe appropriately.

Contact check circuit 6 includes N-channel MOS transistors 1–5 connected in series between pads P0 and P6. Gates of N-channel MOS transistors 1–5 are connected respectively to pads P1–P5. Internal circuit 7 performs a prescribed operation according to a supply voltage and a signal applied externally through pads P0–P4.

At contact check prior to a burn-in test, a probe (not shown) of a semiconductor testing apparatus is brought into contact with each one of pads P0–P6. If each one of pads P0–P4 is in appropriate contact with a probe, N-channel MOS transistors 1–4 are rendered conductive when a ground potential GND is applied to a probe corresponding to ground pad P0, and, each one of probes corresponding to pads P1–P4 are driven to a "H (:logical high)" level.

If pads P0–P6 contact with probes appropriately, a current flows between a probe corresponding to check pad P6 and a probe corresponding to ground pad P0, when a probe corresponding to chip select pad P5 is driven to a "H" level and an appropriate voltage is applied to a probe corresponding to check pad P6, at this state. If at least one of pads P0–P6 is not in appropriate contact with corresponding probe, however, current does not flow.

Thus contact check between pads P0–P6 of semiconductor device 8 and probes of the semiconductor testing apparatus is allowed by monitoring the current flowing into the probe corresponding to check pad P6.

In addition, as only one measurement per chip is required for check, necessary time can be reduced to only 1/n (n is a number of power supply or signal pads used at burn-in test. In the figure n=4) that required in the conventional art.

Further, contact check of a probe and a pad to which a positive power supply potential such as power supply voltage Vcc or a boosted potential Vpp is applied, which is difficult in a conventional contact check method where a negative potential is applied to pads P1–P4, is possible since pads P1–P4 attain a "H" level.

Figure 2:
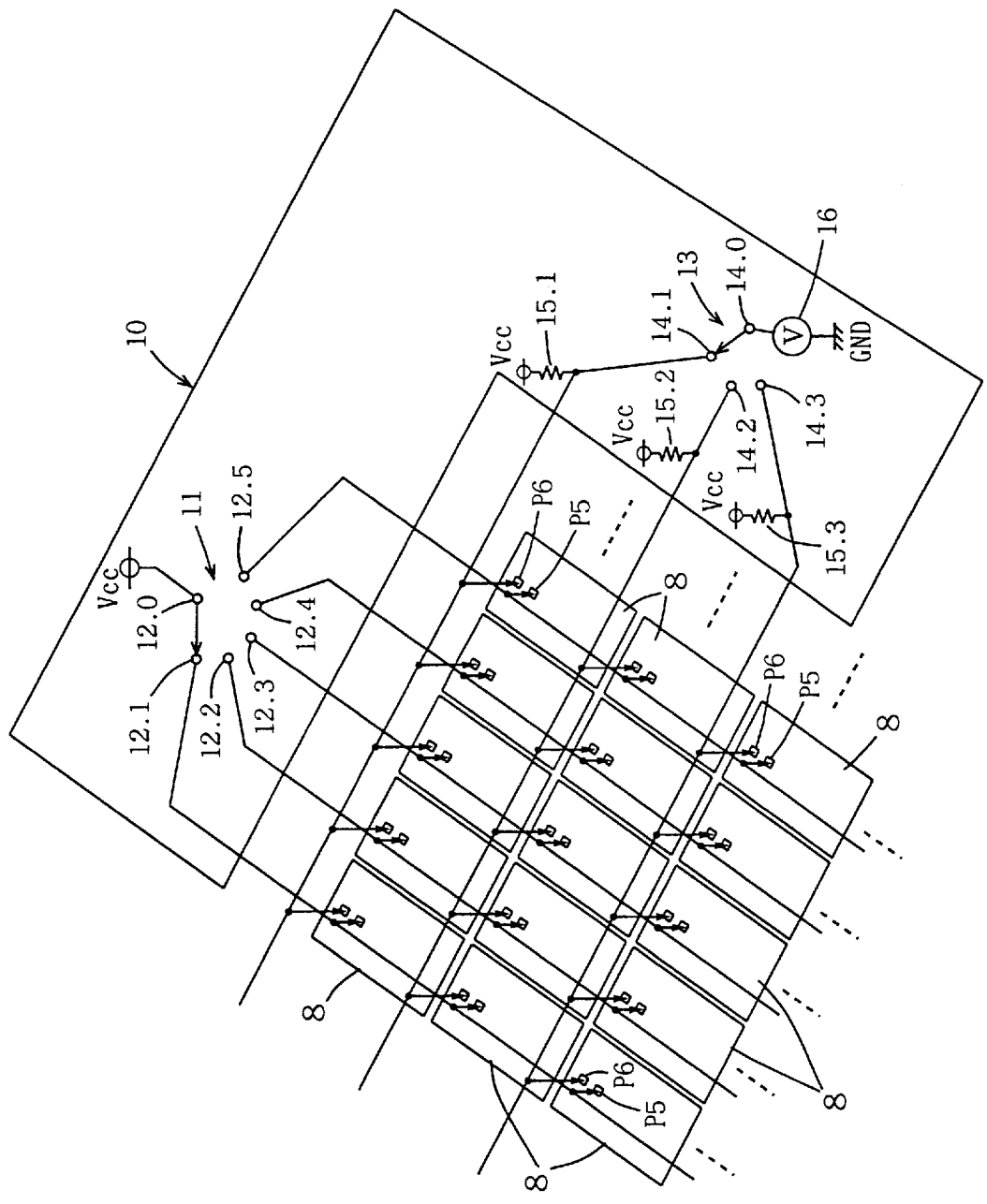
FIG. 2 is a partially omitted schematic illustration showing a method of contact check of the semiconductor device shown in FIG. 1.

FIG. 2 is a schematic diagram specifically illustrating a contact check method of semiconductor device 8 of FIG. 1.

With reference to FIG. 2, multiple semiconductor devices 8 in X rows and Y columns (X and Y are natural numbers) are formed on a wafer surface. A semiconductor testing apparatus 10 includes relays 11, 13, resistive elements 15.X (x is a natural number from 1 to X), and a voltmeter 16. Chip select pads P5 of all semiconductor devices 8 in yth column (y is a natural number from 1 to Y) are connected in common with a switching terminal 12.y of relay 11 via a probe (not shown). An "H" level (power supply potential Vcc) is applied to a common terminal 12.0 of relay 11. Check pads P6 of all semiconductor devices 8 in xth row are connected in common with switching terminal 14. X of relay 13 via a probe (not shown). Switching terminal 14.x of relay 13 is connected to a line of power supply potential Vcc via resistive element 15.x for pulling up. Common terminal 14.0 of relay 13 is connected to voltmeter 16.

At a contact check, first, an "H" level is applied to a probe corresponding to pads P1–P4 of each semiconductor device 8. A ground potential GND is applied to ground pad P0. Thereafter, an "H" level is applied to a probe corresponding to chip select pad P5 of each semiconductor device 8 in the first column, by conducting a current between terminal 12.0 and terminal 12.1, for example, of relay 11. Then, a probe corresponding to check pad P6 of each semiconductor device 8 in the first row is connected to voltmeter 16, by conducting a current between terminal 14.0 and terminal 14.1, for example, of relay 13.

When pads P0–P6 of semiconductor device 8 at the first row, the first column, are in suitable contact with probes, voltmeter 14 exhibits voltage lower than pull-up voltage Vcc because of the current from a line of power supply potential Vcc to semiconductor device 8 via resistive element 15.1. When the pads are not in appropriate contact with the probes, voltmeter indicates pull-up voltage Vcc since no current flows from the line of power supply potential Vcc to semiconductor device 8 via resistive element 15.1. In the above described manner, contact check of semiconductor device 8 at the first row and the first column, is performed. Other semiconductor devices 8 are also checked in the same manner.

[Second Embodiment]

Figure 3:
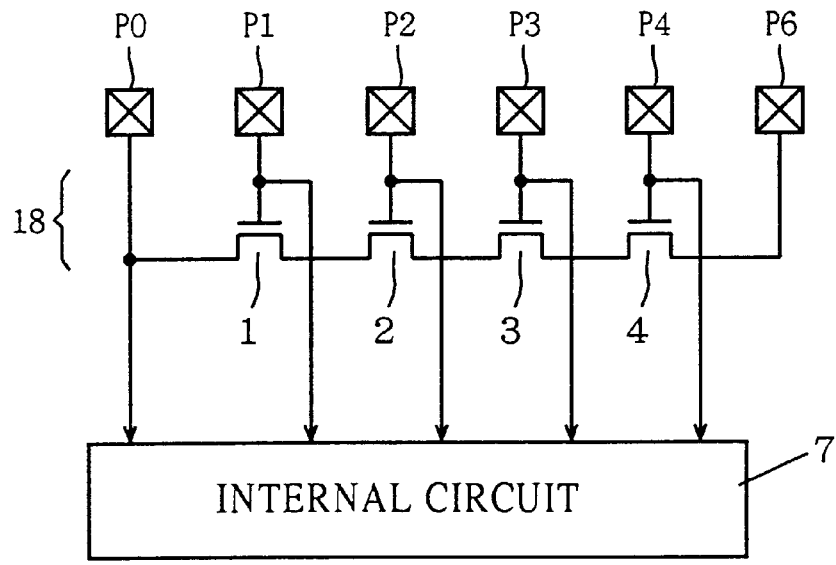
FIG. 3 is a schematic diagram showing a configuration of a semiconductor device according to a second embodiment of the invention.

FIG. 3 is a schematic diagram showing a configuration of a semiconductor device 17 in accordance with the second embodiment of the invention. Referring to FIG. 3, semiconductor device 17 includes pads P0–P4 and P6, a contact check circuit 18, and internal circuit 7. Semiconductor device 17 differs from semiconductor device 8 in that chip select pad P5 and N-channel MOS transistor 5 are not provided.

In semiconductor device 17, power supply or signal pad P4 used in a burn-in test is also used as a chip select pad at the contact check. Therefore, the number of pads to be checked as well as layout area can be reduced.

Figure 4:
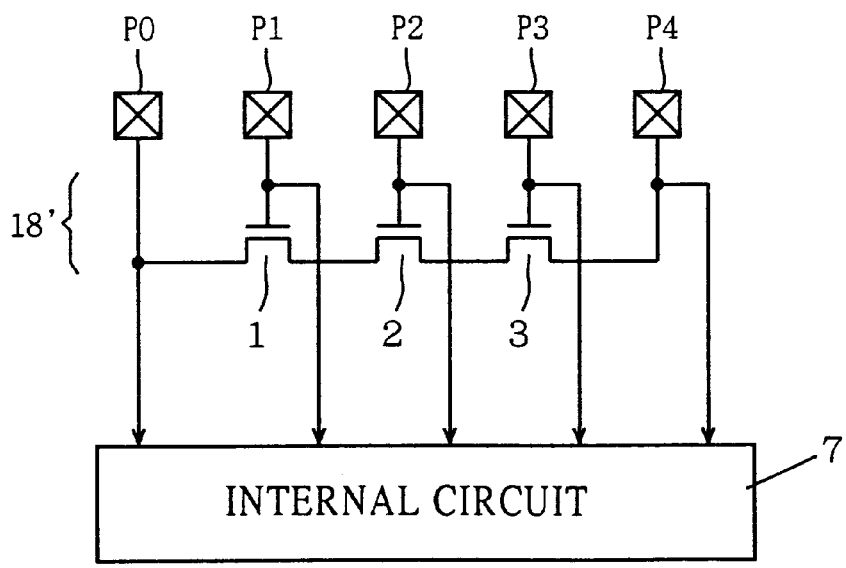
FIG. 4 is a schematic diagram showing an improvement of the semiconductor device of FIG. 3.

In addition, as shown in FIG. 4, it is possible to use pad P3 as a chip select pad and pad P4 as a check pad, by removing check pad P6 and N-channel MOS transistor 4 and then connecting pad P4 to the drain of N-channel MOS transistor 3.

[Third Embodiment]

Figure 5:
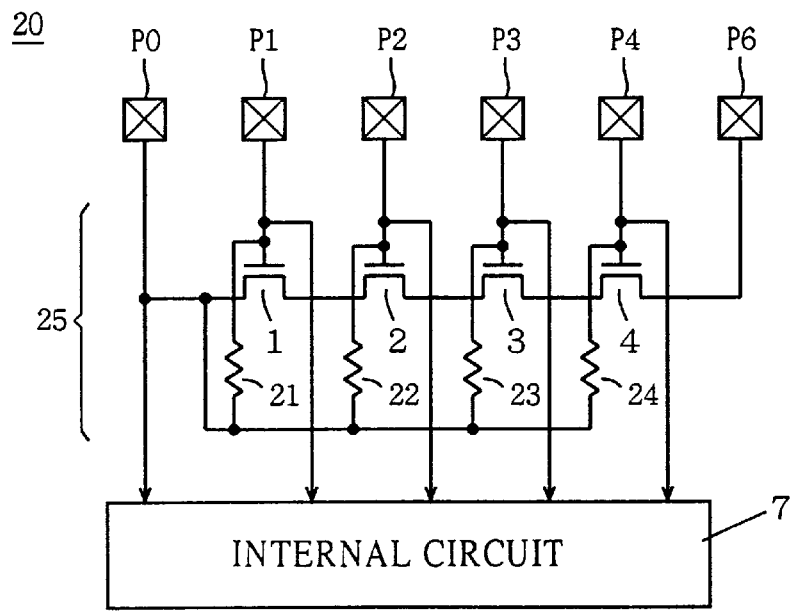
FIGS. 5 to 7 are schematic diagrams showing configurations of semiconductor devices according to third to fifth embodiments of the invention.

FIG. 5 is a schematic diagram showing a configuration of a semiconductor device 20 in accordance with the third embodiment of the invention.

As shown in FIG. 5, semiconductor device 20 is provided with pads P0–P4 and P6, a contact check circuit 25, and internal circuit 7. The difference between semiconductor device 20 and semiconductor device 17 of FIG. 3 is that resistive elements 21–24 for pulling down are newly provided. Resistive elements 21–24 are connected between gates of N-channel MOS transistors 1–4 and pad P0, respectively. Here, resistive elements 21–24 are formed of a material constituting a gate of a transfer gate, a material constituting a bit line, or diffusion resistance layer, for example. Resistive elements 21–24 may also include a MOS transistor to the gate of which a constant potential is applied.

In semiconductor device 20, when pad P1 is not in appropriate contact with a probe, N-channel MOS transistor 1 can surely be rendered nonconductive since a gate of N-channel MOS transistor 1 is grounded via a resistive element 21 and pad P0. Thus, when pad P1 and a probe do not contact appropriately, the gate of N-channel MOS transistor 1 would not be charged to a positive potential, whereby mistake in check induced from conduction of N-channel MOS transistor 1 is prevented.

[Fourth Embodiment]

Figure 6:
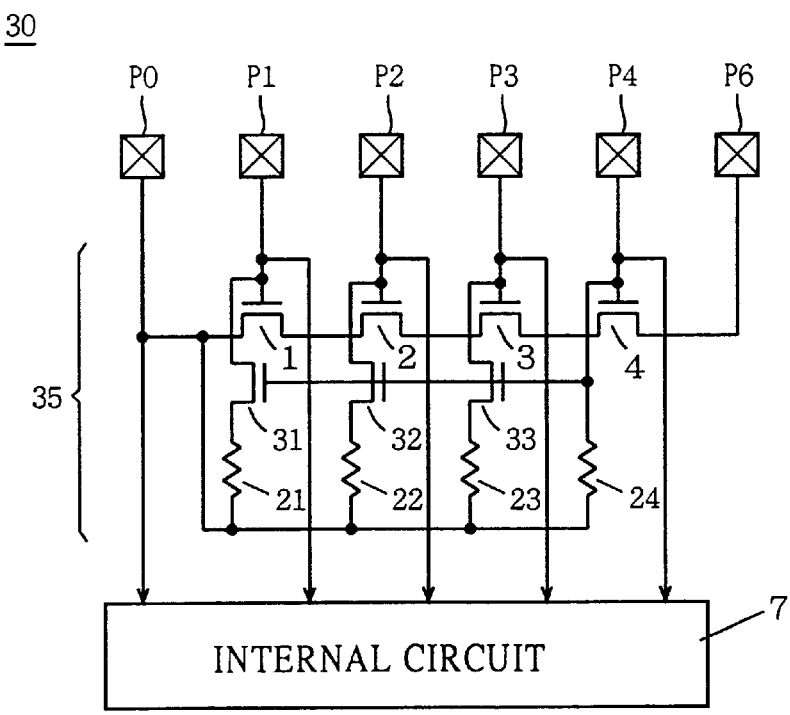

FIG. 6 is a schematic diagram showing a configuration of a semiconductor device 30 in accordance with the fourth embodiment of the invention.

Referring to FIG. 6, a semiconductor device 30 includes pads P0–P4 and P6, a contact check circuit 35, and internal circuit 7. Semiconductor device 30 differs from semiconductor device 20 of FIG. 5 in that N-channel MOS transistors 31–33 are provided additionally. N-channel MOS transistors 31–33 are connected between gates of N-channel MOS transistors 1–3 and resistive elements 21–23, respectively, with the gates of N-channel MOS transistors 31–33 connected together to the gate of N-channel MOS transistor 4.

In semiconductor device 30, N-channel MOS transistors 31–33 are nonconductive except when an "H" level signal as a chip select signal is applied to pad P4 used as a chip select pad. Thus, a current flow from pads P1–P3 to ground pad P0 via resistive elements 21–23 is prevented, facilitating reduction in power consumption.

[Fifth Embodiment]

Figure 7:
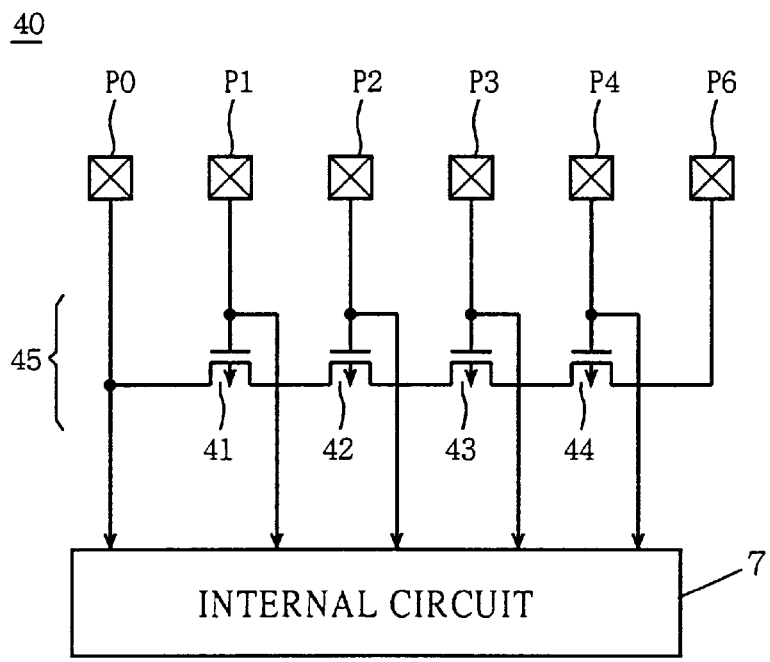
Figure 8:
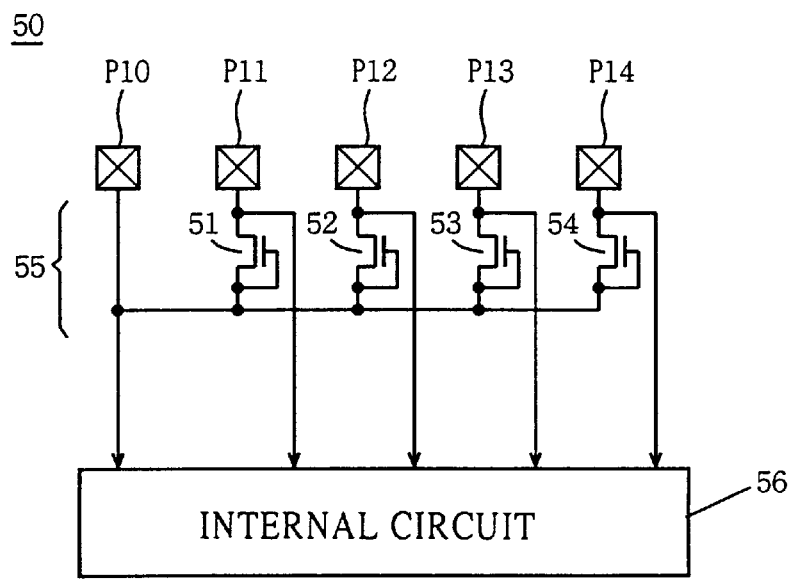
FIG. 8 is a schematic diagram showing a configuration of a conventional semiconductor device.
Figure 9:
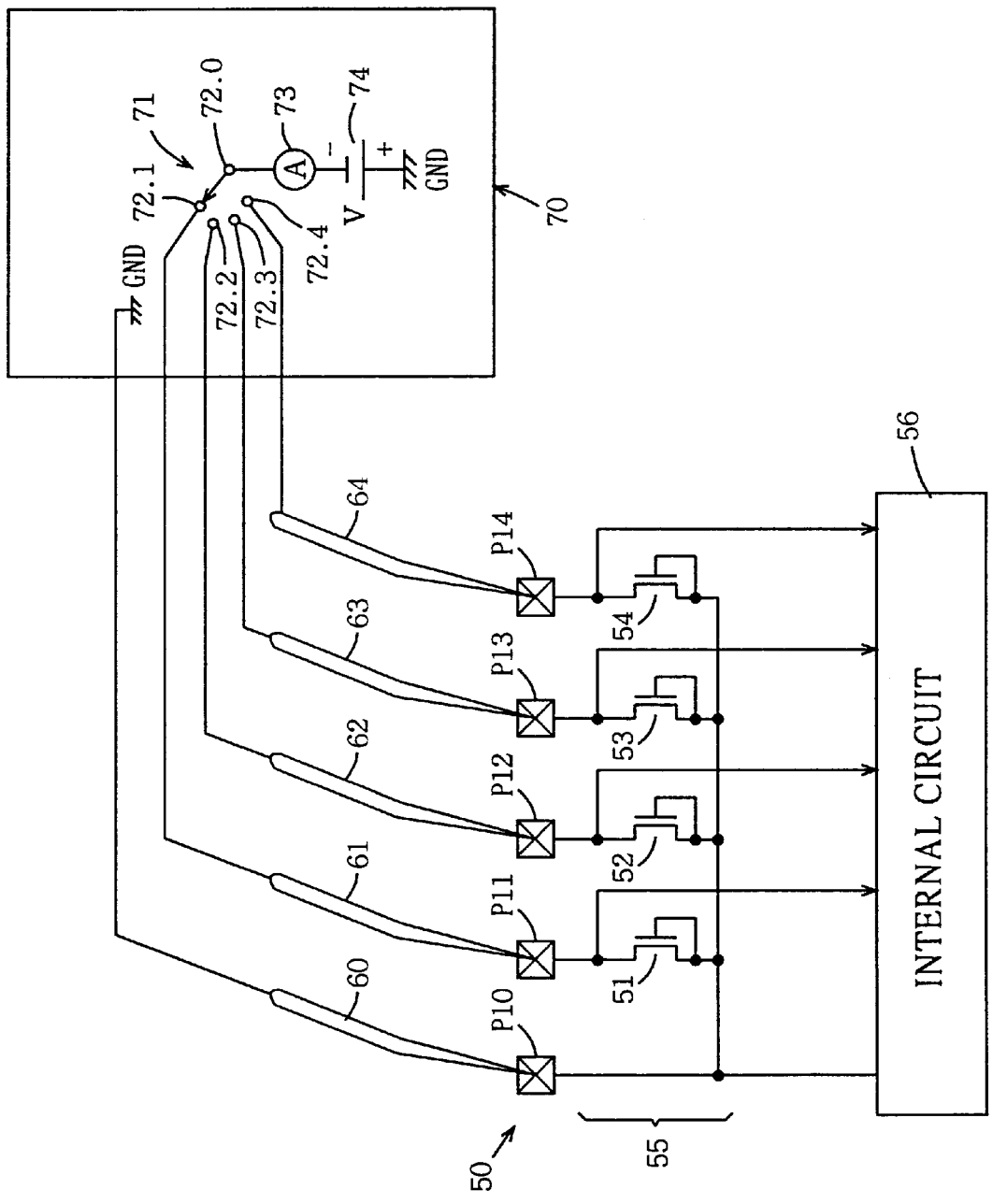
FIG. 9 is a schematic diagram showing a method of contact check of the semiconductor device shown in FIG. 8.

FIG. 7 is a schematic diagram showing a configuration of a semiconductor device 40 in accordance with the fifth embodiment of the invention.

With reference to FIG. 7, semiconductor device 40 includes pads P0–P4 and P6, a contact check circuit 45 and internal circuit 7. Semiconductor device 40 is different from semiconductor device 17 of FIG. 3 in that N-channel MOS transistors 1–4 are replaced with P-channel MOS transistors 41–44.

At the contact check, conduction between pads P0 and P6 is checked with ground potential GND applied to ground pad P0 and a negative potential applied to each one of pads P1–P4. Presence of a current between pads P0 and P6 is determined to represent an appropriate contact between pads P0–P6 and probes, whereas, absence of current between pads P0 and P6 means failure of an appropriate contact between pads P0–P6 and probes.

The above described embodiment is advantageous when a positive potential cannot be applied to pads P0–P4.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having first to Nth pads (N is an integer equal to or larger than 3) for receiving external signals, and a contact check circuit for performing a contact check between first to Nth probes of a semiconductor testing apparatus and said first to Nth pads prior to a test, wherein said contact check circuit includes first to N-2th transistors connected in series between said first pad and said Nth pad and having respective input electrodes connected to said second to N-1th pads, and at said contact check, a test signal is applied to each one of said second to N-1th probes in order to render each one of said first to N-2th transistors conductive, and conduction between said first and Nth probes is checked.

2. The semiconductor device according to claim 1, wherein said contact check circuit further includes first to N-2th resistive elements connected between input electrodes of said first to N-2th transistors and said first pad, respectively, and an inactivation potential is applied to said first probe in order to render said first to N-2th transistors nonconductive at the time of said contact check.

3. The semiconductor device according to claim 1, wherein one of said second to N-1th pads is used as a chip select pad, and a transistor corresponding to the pad is used as a first chip select transistor, and at the time of said contact check, a chip select signal instead of said test signal is applied to a probe corresponding to said chip select pad in order to select said semiconductor device by making said first chip select transistor conductive.

4. The semiconductor device according to claim 3, wherein said contact check circuit further includes, second to N-2th chip select transistors having their input electrodes connected together to an input electrode of said first chip select transistor, and having their first electrodes connected respectively to input electrodes of transistors other than transistor used as said first chip select transistor among said first to N-2th transistors;

a first resistive element connected between an input electrode of said first chip select transistor and said first pad; and second to N-2th resistive elements respectively connected between second electrodes of said second to N-2th chip select transistors and said first pad; and at said contact check, an inactivation potential is applied to said first probe in order to render said first to N-2th transistors and said second to N-2th chip select transistors nonconductive.

* * * * *